United States Patent [19]

Thomas et al.

[11] Patent Number: 4,878,934

[45] Date of Patent: Nov. 7, 1989

[54] PROCESS AND APPARATUS FOR COATING GLASS

[75] Inventors: Jean-François Thomas, Ottignies; Robert Terneu, Thiméon; Albert Van Cauter, Charleroi; Robert Van Laethem, Loverval-Gerpinnes, all of Belgium

[73] Assignee: Glaverbel, Brussels, Belgium

[21] Appl. No.: 147,551

[22] Filed: Jan. 19, 1988

Related U.S. Application Data

[63] Continuation of Ser. No. 930,756, Nov. 14, 1986, abandoned.

[30] Foreign Application Priority Data

Dec. 20, 1985 [GB] United Kingdom ............... 8531424

[51] Int. Cl.$^4$ ............................................. C03C 17/09
[52] U.S. Cl. ................................... 65/60.52; 65/60.1; 65/60.3; 65/181; 118/50.1; 118/326; 118/718; 427/109; 427/166; 427/226
[58] Field of Search ..................... 65/60.1, 60.3, 60.52, 65/90, 181, 193; 118/50.1, 326, 718; 427/109, 166, 226

[56] References Cited

U.S. PATENT DOCUMENTS

| | | | |
|---|---|---|---|
| 3,679,386 | 6/1970 | Kushihashi et al. | 65/60 |
| 4,188,199 | 2/1980 | Van Laethem et al. | 65/60 C |
| 4,293,326 | 10/1981 | Terneu et al. | 427/109 |
| 4,329,379 | 5/1982 | Terneu et al. | 427/166 |
| 4,349,371 | 9/1982 | Laethem et al. | 65/60.52 |
| 4,529,627 | 7/1985 | Zurbig | 65/60.55 |
| 4,655,810 | 4/1987 | Van Cauter et al. | 65/60.4 |

FOREIGN PATENT DOCUMENTS

| | | |
|---|---|---|
| 27403 | 10/1980 | European Pat. Off. . |
| 0041010 | 12/1981 | European Pat. Off. . |
| 0099480 | 2/1984 | European Pat. Off. . |
| 1307361 | 4/1969 | United Kingdom . |
| 2131792 | 6/1984 | United Kingdom ............... 65/60.52 |

OTHER PUBLICATIONS

Viguié, S. R., "Chemical vapour deposition from an Aerosol", *Science and Technology of Surface Coating*, Academic Press (1974), pp. 169–175.

*Primary Examiner*—Arthur Kellogg
*Attorney, Agent, or Firm*—Spencer & Frank

[57] ABSTRACT

Apparatus for use in pyrolytically forming a metal oxide coating on an upper face of a hot glass substrate 1 in sheet or ribbon form comprises conveyor means 2 for conveying the substrate 1 in a downstream direction 3 along a path also indicated at 1 and a roof structure 5 defining a coating chamber 6 opening downwardly onto the path and comprising a passageway 11 along which coating precursor vapor and oxidizing gas can be conducted downstream in contact with the upper substrate face during the conveyance of the substrate. The roof structure 5 defines, in or adjacent the upstream end of the passageway 11, a mixing zone 7 which opens downwardly onto the substrate path 1. Means such as spray nozzle 35 is provided for injecting coating precursor material into the mixing zone 7 from a height of at least 50 cm above the level of the substate path 1. Means such as ducting 58 is provided for injecting oxidizing gas into the mixing zone in which coating precursor material and oxidizing gas can be brought together, mixed and heated to form an atmosphere comprising an intimate mixture of precursor vapor and oxidizing gas. The mixing zone 7 is in communication with the passageway 11 to permit a stream of such atmosphere to flow along the passageway from the mixing zone.

46 Claims, 8 Drawing Sheets

PROCESS AND APPARATUS FOR COATING GLASS

This application is a continuation of application Ser. No. 930,756, filed Nov. 14, 1986, now abandoned.

BACKGROUND OF THE INVENTION

1. Field of the Invention.

This invention relates to a process of pyrolytically forming a metal oxide coating on an upper face of a hot glass substrate in sheet or ribbon form during its conveyance in a downstream direction along a path leading beneath a downwardly opening coating chamber, in which process said coating is formed from coating precursor vapour and an oxidising gas which are fed in the downstream direction along a passageway of said coating chamber to which said substrate face is exposed. The invention also relates to apparatus for use in pyrolytically forming a metal oxide coating on an upper face of a heated glass substrate in sheet or ribbon form, said apparatus comprising conveyor means for conveying a said substrate in a downstream direction along a path and a roof structure defining a coating chamber opening downwardly onto said path and comprising a passageway along which coating precursor vapour and oxidising gas can be conducted downstream, in contact with a said upper substrate face during said conveyance of the substrate.

2. Description of the Related Art.

Such processes and apparatus are useful in the manufacture of coated glass for various purposes, the coating being selected to confer some particular desired property on the glass. Especially important examples of coatings which may be applied to glass are those designed to reduce the emissivity of the coated face in respect of infra-red radiation, especially infra-red radiation having wavelengths in excess of $3\mu m$, and those designed to reduce the total energy transmissivity of the coated glass in respect of solar radiation. It is known, for example, to provide glass with a low infra-red emissivity coating of tin dioxide for heat conservation purposes, and it is also known to provide glass with a solar energy transmissivity reducing coating of a metal oxide such as titanium dioxide or of a mixture of metal oxides such as $Fe_2O_3=CoO=Cr_2O_3$ with the principal object of reducing solar heat gain or glare.

Because the coatings are usually applied to a thickness of between about 30 nm and 1200 nm, depending on the nature of the coating material and the properties required, variations in the thickness of a coating will not only mean that the required infra-red emissivity or energy transmissivity is not uniformly acheived, but also that objectionable interference effects may occur. A regular and uniform thickness is therefore important for good optical quality as well as for achieving the required emissivity or transmissivity. It will be apparent that coatings which are applied to glass to be used for glazing purposes should have a high and uniform optical quality. The coatings should therefore also be free from stains and other localised defects.

It is known to deposit coatings from coating precursor material in the vapour phase as opposed to the liquid phase, and that this can promote freedom from localised defects. This freedom from localised defects is achieved by directing separate streams of highly concentrated vaporised coating precursor and oxidising gas towards the substrate so that they mix and react only while in contact with the substrate, so that the oxide is formed directly onto that substrate and not in the atmosphere above it whence particles of coating material could fall onto the substrate to become incorporated into the coating as defects. The vapour laden atmosphere is then aspirated away from the substrate before cooled precursor vapour or reaction products formed in the atmosphere out of contact with the substrate can deposit as defects on or in the coating being formed.

Known vapour phase coating techniques have not resulted in the formation of coatings which have a regularity of thickness which is sufficient to meet ever more exacting commercial quality requirements especially for large glazing sizes as are increasingly demanded by modern architectural practice. Attempts have been made to introduce a concentrated stream of coating precursor vapour into the coating chamber uniformly in time and over the entire width of the substrate to be coated and more volatile coating precursor materials have been selected in efforts to facilitate this. Various steps have also been taken to modify known techniques in order to ensure that the coating precursor vapour flows in a carefully controlled, turbulence free manner in contact with the substrate during coating formation. Unfortunately, it has been found impossible to exercise the degree of control required over the introduction of the vapour and its behavior in the coating chamber when operating on a commercial scale, with the result that unpredictable thickness variations occur in the coating and a proportion of the coated glass produced is not of an acceptable quality.

SUMMARY OF THE INVENTION

The present invention represents a radical departure from what has previously been though desirable, and even essential, and has for its object to provide a pyrolytic coating process which is easier to perform while giving a coating of high and uniform optical quality and of more regular thickness, and which readily lends itself to the formation of coatings at high deposition rates.

According to the present invention, there is provided a process of pyrolytically forming a metal oxide coating on an upper face of a hot glass substrate in sheet or ribbon form during its conveyance in a downstream direction along a path leading beneath a downwardly opening coating chamber, in which process said coating is formed from coating precursor vapour and an oxidising gas which are fed in the downstream direction along a passageway of said coating chamber to which said substrate face is exposed, characterised in that coating precursor material and oxidising gas are introduced into a mixing zone of the chamber in or adjacent the upstream end of said passageway, heat energy is supplied to said mixing zone and the precursor material and oxidising gas are thoroughly mixed in the mixing zone while exposed to the substrate but at a height such that coating formation commences from a substantially homogeneous vapour mixture, and such mixture is caused to flow continuously along said passageway, in contact with the upper face of the substrate.

We have found that the present invention facilitates the formation of coatings of high and uniform quality and enable such coatings to be formed to a more regular thickness than has hitherto been possible.

The invention is beneficial in the formation of thin coatings, and also in the formation of relatively thick coatings, for example those above 200 nm in thickness. We have found that rapid removal of the vapour laden atmosphere is not a requirement for a substantially defect-free coating, so more time can be allowed for the coating to build up to a desired thickness.

It is surprising that forming an intimate mixture of the coating precursor and an oxidising atmosphere within the mixing zone while exposed to the substrate but at a height such that coating formation commences from a substantially homogeneous vapour mixture, and then causing that mixture to flow along the passageway in contact with the substrate is able to achieve a coating which is substantially free from unpredictable variations in its thickness.

It is also noteworthy that such mixing does not involve the premature formation of coating reaction products out of contact with the substrate in the atmosphere which would feed along the passageway above the substrate so that they could fall as spurious deposits forming defects on or in the coating. A possible explanation for this is that because the mixing zone opens downwardly onto the substrate path and heat energy is supplied to it, whether by the substrate alone or by some additional heating means, any reaction products in the atmosphere can be maintained sufficiently hot that they do not in practice cause problems.

The adoption of the present invention greatly facilitates the introduction of coating precursor material into the coating chamber at high volume rates, as may be required for the formation of rather thick coatings. It greatly facilitates handling of the coating precursor material prior to its entry into the mixing zone, and it also allows the use of coating precursor material of lower volatility than is required by known vapour phase coating techniques, so a wider choice of coating precursor materials, in particular of less expensive precursor materials, is available.

Typically, previously known vapour phase coating processes are performed in rather short coating chambers, a length of less than 1 metre is usual, and, depending of course on the speed of the substrate, this implies a contact time between the coating precursor vapours and the substrate of about 2 to 5 seconds. This dwell time is limited so that coating reaction products are rapidly removed from contact with the nascent coating in order that they will not form defects. Of course such a short dwell time is one reason why those processes do not lend themselves to the formation of rather thick coatings. In marked contrast to this, when performing the present invention, the coating chamber may have a length which is so related to the speed of conveyance of the substrate that any increment of the length of the substrate remains exposed to coating precursor vapour for twenty seconds or even longer. This facilitates the formation of thick coatings, for example those above 200 nm in thickness as may be required for infra-red radiation screening purposes, and we have rather surprisingly found that there is no adverse effect on the quality of the coating formed. It will be appreciated that where the coating is deposited between the exit from a glass ribbon forming plant and an annealing lehr, the speed of advance of the ribbon will be governed by the rate at which the ribbon is formed, and that this will vary according to the capacity and the type of ribbon forming plant, for example whether it is a glass drawing machine or a float glass producing plant, and also according to the thickness of the glass being produced. However even the highest glass ribbon speeds are usually less than 12 metres per minute, and accordingly a twenty second exposure time can usually be assured if said passageway has a length such that its downstream end is at least 5 metres from the location where coating formation commences.

The precise way in which the coating precursor material is introduced into the coating chamber is not critical for achieving thickness regularity. The coating precursor material may be introduced into the mixing zone of the coating chamber in one or more directions which does not or which do not intersect the substrate, but is preferably introduced downwardly and in the downstream direction so as to promote a general downstream flow of the atmosphere within the coating chamber.

The coating precursor material may for example be injected into the mixing zone as an aerosol spray, but in especially preferred embodiments of the invention, the coating precursor material is sprayed into the mixing zone in one or more streams of droplets. The invention can thus be adapted to the formation of coatings which have hitherto only been achieved by liquid phase coating techniques, and this can be done without also importing certain disadvantages known to be associated with prior art liquid phase coating techniques. In such prior art techniques it is very difficult to avoid staining of the coating formed due to splashing of the sprayed droplets when they impact against the substrate. This problem need not arise when adopting this invention. Also when conventional liquid phase coating techniques are used, contact between the usually rather large quantities of coating solution sprayed and the hot substrate give rise to considerable difficulties, especially when the coating is deposited on a freshly formed ribbon of hot glass, because it interferes with a subsequent annealing treatment. The result of this is that the glass is badly annealed, and in some cases residual stresses locked in the glass ribbon after cooling make it difficult to cut, and may even be such as to cause it to break when it is cut into sheets. This problem can also be avoided when adopting the present invention.

Advantageously, streams of coating precursor material and gas are introduced into said mixing zone in different directions so as to create turbulence to effect said mixing. This is a very simple way of effecting mixing without requiring any additional mixing apparatus to be subjected to the rather hostile conditions prevailing in the mixing zone.

The temperature at which the coating reactions take place has an important influence on the way in which the coating builds up. In general, coating reactions proceed not only at higher rates but also with increased coating yield with increase in temperature, and in addition, it has been found that coatings formed at higher temperatures have a better adherence to the glass and thus improved durability. Furthermore, the higher the temperature of the coating chamber is, the less likely it is that any coating precursor vapours will condense on its roof whence such material could drip down to stain the coating. Thus for example, it is preferred to supply heat to the mixing zone at least in part by directing radiant heat into it. This helps to maintain a high temperature which is found to be beneficial for the quality and yield of the coating formed and is of particular importance in promoting evaporation when the coating precursor material is introduced in the liquid phase into a mixing zone of the downwardly opening coating chamber.

Preferably, at least some of said gas which is fed to said mixing zone has been preheated. This is of particular value in inhibiting condensation and entraining the precursor vapours formed so that on contact with the substrate, heat loss from the subtrate is reduced.

In especially preferred embodiments of the invention, atmospheric material within said passageway is heated from above. This is particularly beneficial for inhibiting condensation on the roof of the passageway, and also enables conditions to be controlled so that the temperature along the passageway remains substantially constant to give important benefits in increasing coating formation rates and coating yield, and in promoting durability of the coating.

The passageway may be heated uniformly across its width, but it has been noted when performing various conventional coating processes on a continuous ribbon of freshly formed glass that the coating formed at the margins of the ribbon tends to be thinner than it is at the centre. This thinner marginal coating tends to be regular and predictable, and it has been attributed to various causes, but one particular cause worthy of note is that the ribbon has a natural tendency to cool via the side walls of the coating chamber so that the ribbon margins are cooler than its centre. In fact, we have noted that when using a conventional technique for coating a freshly formed ribbon of hot glass, even if the glass enters the coating chamber with a substantially uniform temperature profile across its width, as much as one sixth of the ribbon width at each side margin may be of unacceptable quality, and so one third of the total ribbon width is useful only as cullet. This tendency towards thinner marginal coating deposits can be counteracted by heating the passageway differentially across its width so that atmospheric material over the ribbon margins is heated more than that at the centre of the passageway.

Advantageously, atmospheric material is aspirated away from said substrate face at least at the downstream end of said passageway. This promotes a flow of atmospheric material along and in contact with the substrate while allowing only diffuse forces to be exerted on the atmospheric material in the upstream portion of the coating chamber where coating formation commences. Coating quality can be adversely affected if strong local currents exist in that upstream portion. The adoption of such downstream end aspiration also promotes the removal of coating reaction products and excess coating precursor material which could stain the coating, so enhancing the quality of the coating formed. Preferably, at the downstream end of said passageway portion, atmospheric material is aspirated away from the substrate into exhaust ducting having one or more inlets located over the substrate and extending across at least the major part of its width. Such frontal aspiration allows an increased aspiration at the downstream end of the coating chamber without a commensurate increase in the velocity of the gas entering the aspirators which is important for uniform flow of the precursor-laden atmosphere in contact with the substrate. The aspirated material can thus travel substantially in the downstream direction until it enters the ducting, and this gives least disturbance to the flow pattern within the passageway. Such frontal aspiration over at least the major part of the substrate width is particularly desirable when very large quantities of coating precursor material are discharged into the chamber.

The use of such frontal aspiration alone, however, can give rise to a higher concentration of coating precursor vapour along the centre of the passageway than over the substrate margins. This is another possible cause of thinner coatings on the substrate margins. In order to reduce this tendency, and to increase the usefully coated width of the substrate, it is especially preferred that aspirating forces are generated in side exhaust ducting located to cause atmospheric material above the substrate to flow outwardly away from a central part of the substrate path over at least a part of the length of said passageway. The adoption of this preferred feature gives advantages which are considered to be of particular importance. It promotes a good spread of the precursor-laden atmosphere over the full width of the substrate, thus increasing the usefully coated width of the substrate. In addition, it enables earlier removal of coating reaction products and excess coating precursor material which could settle on the coating to stain it. Also, depending on pressure conditions above and below the substrate at the coating chamber there may be a tendency for the atmosphere from beneath the substrate to flow upwards past its sides, where it would dilute the precursor-laden atmosphere above the substrate, this being yet another possible cause of thinner coating deposits on the substrate margins. This tendency is also inhibited over the zone of outward aspiration.

Preferably, said atmospheric material is aspirated outwardly over a zone extending along substantially the whole length of said passageway. This increases the benefits afforded by such outward aspiration. Again, we have found that the usefully coated width can be increased, and this is particularly useful when coating a freshly formed continuous ribbon of glass. Under optimum operating conditions, we have found that the useful product yield is limited not so much by the optical quality and thickness of the coating at the ribbon margins, as by the quality of the glass itself at those margins. It will be borne in mind that due to various factors, a few centimetres at each margin of a ribbon of glass are of irregular form and unacceptable optical quality and must in any event be discarded or used as cullet.

In some preferred embodiments of the invention, said atmospheric material is aspirated outwardly at a level beneath the substrate. We have found that the adoption of this feature tends to hold a layer of dense precursor-rich atmosphere down onto the ribbon for uniform coating across its full width, again increasing the benefits afforded by the outward aspiration.

We have previously referred to the possibility of atmospheric material flowing up past the side margins of the substrate and diluting the precursor laden atmosphere above it. Depending on pressure conditions above and below the substrate at the coating chamber there may alternatively be a tendency for the precursor-laden atmosphere to flow beneath the substrate where it would be able to deposit an undesired coating on its under surface. Depending on the flow pattern of atmospheric currents in and below the coating chamber, this undesired coating may be more or less regular, but so thin as to give rise to highly objectionable interference effects, for example it may be a more or less regular coating whose thickness decreases towards the centre of the substrate, or it may be a rather irregular coating of a pattern thought by some to be reminiscent of the markings on a backgammon board. This tendency is to some extent inhibited by outward aspiration as aforesaid, but in order to inhibit this tendency further, especially preferred embodiments of the invention provide that over at least part of the length of the chamber, flow of atmospheric material past the side edges of the substrate and between zones vertically above and vertically below that substrate is inhibited.

One cause of defects in a pyrolytically formed coating is particles of extraneous material which become incorporated in the coating during its formation. Unused coating precursor material and coating reaction products, including intermediate reaction products and other pollutants such as dust (the coating precursor material is itself considered a pollutant wherever it may contact the hot glass outside the coating chamber), tend to spread upstream from the chamber into which the coating precursor material is discharged, no matter how small the entrance through which the glass enters that chamber is made, and in fact those pollutants are apt to contact the glass before it reaches the coating region and to leave spurious deposits on the substrate which remain there to be incorporated in the coating as defects.

In preferred embodiments of the invention, gas is discharged into the environment of the substrate so as to form a continuous current flowing in the downstream direction beneath each margin of the substrate and along at least part of the length of said chamber.

Surprisingly, it has been found that the adoption of this preferred feature results in a significant clearance of the atmosphere which would be in contact with the glass prior to its entry into the coating chamber, so that there is a considerable reduction in the amount of pollutants there available to form spurious deposits on the glass before coating.

A possible explanation for this phenomenon is as follows.

Upstream of the coating chamber there will be plant for heating the glass substrate, or for actually forming a hot glass substrate, and downstream of the coating chamber there will usually be means, for example an annealing lehr, allowing controlled cooling of the coated substrate. In such constructions there may be a return current of atmospheric material which flows in the upstream direction beneath the substrate path. As this return current flows upstream it may tend to rise above the substrate path, so that any entrained pollutants are liable to deposit on the substrate so forming defects embedded in the coating, either at the coating/glass interface, or within the thickness of the coating.

Such discharge of gas below the level of the substrate also affords certain very important advantages in reducing undesired under surface coating, and insofar as the quality of the coating formed is concerned.

Advantageously, there is provided such a below substrate current of gas which flows under the full width of the substrate. The adoption of this feature promotes clearance of the atmosphere below the path of the substrate in a highly efficient manner, so avoiding spurious early deposits of material which has been entrained in return currents flowing beneath the substrate in the upstream direction.

Preferably, the gas discharged to form such below substrate current(s) is preheated to within 50° C. of the mean temperature of the substrate immediately prior to coating, so as to reduce any effect the injection of that gas may have on the temperature of the substrate and/or of the atmosphere in the coating region.

In some preferred embodiments of the invention, air is introduced through the roof of said passageway. The adoption of this preferred feature reduces the likelihood of coating material depositing on that roof rather than on the substrate which it is desired to coat so that there is a reduced risk that any such material would fall onto the coated substrate to stain the coating or cause some other defect.

Advantageously, the downstream flow of atmospheric material to which said substrate is exposed is throttled by a marked height reduction in the available flow path along said chamber. The adoption of this feature is helpful in concentrating the flow of precursor-laden atmosphere down close to the substrate and thus promoting the coating yield. This feature may also imply a more lofty mixing zone, and this is helpful for the evaporation of the coating precursor material when that is introduced in the liquid phase, and it promotes mixing of that precursor material and the oxidising gas and the maintenance of a reservoir of atmospheric material uniformly laden with coating precursor vapours which can be drawn downstream into and along the passageway.

Preferably, at least one pair of obliquely inwardly directed streams of gas such as air is introduced into said chamber to throttle the width of the stream of vapour flowing along at least part of the passageway. In this way, the vapour stream can be inhibited from flowing along beyond the side edges of the substrate where it would be wasted. This also protects the side walls of the coating chamber from the precursor material and reaction products, and can create currents of comparatively clean gas along those side walls helping to prevent the downward flow of vapours from the coating chamber.

In especially preferred embodiments of the invention, the coating chamber is substantially closed at its downstream end to prevent interchange of atmospheric material between the downstream end of the coating chamber and a further downstream region of the substrate path. Such closure may for example be effected by exhaust ducting extended across the full width of the coating chamber at its downstream end. The adoption of this feature has the advantage of avoiding any dilution or pollution of the atmosphere in the downstream end of the coating chamber from the region further downstream, and it also prevents currents of the coating chamber atmosphere from interfering with any further processing of the substrate and from depositing any additional undesired material onto the coating.

In particularly advantageous embodiments of the invention, the glass substrate is a freshly formed ribbon of hot glass and the coating is formed after that ribbon leaves a ribbon-forming plant, and before its entrance to an annealing lehr. The coating chamber may thus be located at a position where the glass is already at a temperature appropriate for the pyrolytic coating reactions to take place, so that costs involved in reheating the glass to such a temperature are avoided or substantially reduced. It is also important that the coating should take place within a chamber which is physically distinct from the ribbon-forming plant on the one hand and the annealing lehr on the other hand. If there is no such distinction, and it is common in previously known proposals in this field for the coating to take place within the length of the annealing lehr, then atmospheric conditions within the coating chamber would be apt to be disturbed by currents of gas flowing from the annealing lehr and from the ribbon forming plant—such currents often entrain dust and other pollutants which might become incorporated in the coating as defects—and also, there would be a risk that the pattern of atmospheric currents in the lehr would be disturbed so leading to less favourable annealing conditions.

In some particularly preferred embodiments of the invention, preheated gas is caused to flow downstream into said coating chamber in contact with the substrate. The adoption of this feature is of value in promoting a general downstream flow of the atmospheric material within the coating chamber and has value in conditioning the atmosphere in the zone where coating formation commences. For example, in some such preferred embodiments of the invention, such preheated gas is caused to enter said coating chamber at a higher volume rate over the margins of the substrate than over its centre. This allows at least partial compensation for cooling of the atmosphere within the coating chamber by contact with its side walls.

Indeed the present invention may with advantage be combined with the invention described in our copending British patent application filed 20th Dec. 1985, Application No. 85 31 425, which application describes and claims a pyrolytic coating process in which a hot glass substrate in sheet or ribbon form travels in a downstream direction beneath a coating chamber which opens downwardly towards the substrate and in which a coating is formed on the upper face of said substrate by deposition from coating precursor material, characterised in that the gaseous environment in the immediate vicinity of the upper face of the substrate at least in the zone at which such coating formation commences, is controlled by feeding preheated gas in a downstream direction into said chamber to enter the chamber in contact with the substrate and form a blanket layer which covers the substrate at least as far as that zone.

The present invention is particularly suitable for the formation of coatings at high build up rates, for example at rates in excess of 20 nm/second, and for forming relatively thick coatings, such as coatings of about 200 nm in thickness, and indeed for forming a very thick coating such as a coating of 500 nm to 1000 nm in thickness, on a freshly formed ribbon of glass travelling at several metres per minute from a float tank or other flat glass forming plant.

A particularly important use for a process according to the invention is in the formation of tin oxide coatings using stannous chloride as the coating precursor material. Tin oxide coatings, which reduce the emisivity of the surfaces of glass sheets to which they are applied in respect of long wavelength infra-red radiation, are widely used for reducing heat transfer from glazed structures. This of course is only an example of the purpose for which the process can be used. As another example, the process can be used for forming a coating of titanium dioxide, or a coating of a mixture of oxides such as a mixture of cobalt, iron and chromium oxides.

This invention also includes apparatus for pyrolytically forming a metal compound coating on hot glass, and there is accordingly provided apparatus for use in pyrolytically forming a metal oxide coating on an upper face of a hot glass substrate in sheet or ribbon form, said apparatus comprising conveyor means for conveying a said substrate in a downstream direction along a path and a roof structure defining a coating chamber opening downwardly onto said path and comprising a passageway along which coating precursor vapour and oxidising gas can be conducted downstream in contact with a said upper substrate face during said conveyance of the substrate, characterised in that said roof structure defines, in or adjacent the upstream end of said passageway, a mixing zone which opens downwardly onto the substrate path, means is provided for injecting coating precursor material into the mixing zone from a height of at least 50 cm above the level of the substrate path, means is provided for injecting oxidising gas into the mixing zone in which coating precursor material and oxidising gas can be brought together, mixed and heated to form an atmosphere comprising an intimate mixture of precursor vapour and oxidising gas, said mixing zone being in communication with said passageway to permit a stream of such atmosphere to flow along said passageway from said mixing zone.

Such an apparatus is particularly apt for the formation of high quality coatings which are substantially free from unpredictable thickness variations, at high deposition rates in a continuous process, for example a process as hereinbefore defined. The apparatus is of simple construction and it facilities handling of large quantities of coating precursor material as may be required for forming coatings on rapidly moving substrates. The apparatus can be located at any convenient place.

Advantageously, means is provided for introducing streams of coating precursor material and gas into said mixing zone in different directions so as to create turbulence to effect said mixing. This avoids the need for any additional mixing apparatus.

Preferably, means is provided for preheating at least one stream of said gas entering the mixing zone. The adoption of this feature inhibits the condensation of atmospheric vapours on the walls and roof of the mixing zone where it could cause corrosion, or, in embodiments where the mixing zone is above and open to the substrate, drip down to stain or form some other defect on the substrate being coated.

In some preferred embodiments of the invention, radiant heating means is provided in said mixing zone. This is a very simple way of providing heat for maintaining a high concentration of coating precursor vapour in that zone, and it also inhibits condensation of that vapour there.

In especially preferred embodiments of the invention, means is provided for introducing heat energy into said passageway from above. This inhibits condensation of the coating precursor vapour there, so reducing problems of corroding the roof of the passageway, and it also enables the apparatus to be used in such a way that coating reactions can take place at a uniform temperature along the length of that passageway so giving benefits in coating yield and quality.

Preferably, means is provided for generating aspirating forces on atmospheric material within such passageway to encourage flow of that material along said passageway towards its downstream end and then away from the path of the substrate. Such apparatus is easy to construct and simple to locate, and it promotes a general downstream flow of atmospheric material within the passageway without the need to exert strong forces causing undesired turbulence at the upstream end of the coating station close to the surface of the substrate.

Advantageously, means is provided for generating aspirating forces in side exhaust ducting located to cause atmospheric material above the substrate path to flow outwardly away from the centre of the substrate path over at least a part of the length of the passageway, since this promotes a more uniform distribution of atmospheric material within the passageway and can result in a width-wise increased yield of usefully coated glass. It is also helpful in removing excess coating precursor material and coating reaction products at a stage before they reach the end of that passageway, so reducing risk of corrosion of the walls of that passageway. These advantages are promoted if, as is preferred, such side exhaust ducting is located to aspirate said atmospheric material outwardly over a zone extending along substantially the whole of said passageway.

In some preferred embodiments of the invention, said side exhaust ducting has entrances which are located beneath the level of said path. In addition to facilitating coating by holding down a layer of dense coating precursor vapours against the substrate face being coated, this is beneficial because it facilitates visual inspection of conditions within the passageway through ports which may be provided in its side walls.

In especially preferred embodiments of the invention, said passageway has a top wall which converges towards the glass substrate in the downstream direction. This forces the atmospheric material within that passageway to keep in contact with the substrate even though the quantity of material in that passageway may be diminishing, for example due to outward aspiration of material along the sides of that passageway.

In especially preferred embodiments of the invention, over at least part of the length of the chamber, means is provided for inhibiting flow of atmospheric material past the sides of the substrate path and between zones vertically above and vertically below that path. Such an undesirable flow of atmospheric material could cause irregular deposition of coating material on the upper and/or lower face of the substrate especially at its side margins.

Preferably, such flow inhibiting means comprises baffles, since they are a very simple way of achieving the desired result. Such baffles may be located to create a substantially closed coating chamber, so that the atmosphere therein is not affected by external gas currents. A very simple and preferred way of achieving such substantial closure is to provide conveyor means comprising rollers which are rebated over each margin of the substrate path to define a space for accommodating said baffles between the rollers and the margins of the substrate path. This allows the whole upper face of the substrate to be coated.

In some preferred embodiments of the invention, means is provided for discharging gas into the environment of the substrate path so as to form a continuous current flowing in the downstream direction beneath each margin of the substrate path and along at least part of the path length occupied by said chamber. The use of such apparatus affords certain important advantages in reducing undesirable under surface coating and in promoting the optical quality of the coating which is to be formed, especially as regards its comparative freedom from defects formed at the coating glass interface.

These advantages are enhanced when, as is preferred, means for discharging gas to form such a below path level current is located to discharge gas to form such a current over the full width of the substrate path.

Preferably, means is provided for introducing air through the roof of said passageway. Such air can be introduced to flow along the passageway roof so protecting it from corrosion by vapours within the passageway.

In some preferred embodiments of the invention, the passageway roof is of louvred construction for controlling the introduction of such air, since this is a very simple and inexpensive apparatus for achieving the desired effect, while in other preferred embodiments of the invention, the passageway roof is of porous construction, and means is provided for blowing air through such roof. This gives a very efficient protection for the roof.

Advantageously, said roof structure exhibits a marked drop in height above the path in the downstream direction thereby to throttle the downstream flow of vapour along the coating chamber. The adoption of this feature allows a relatively high upstream zone to give ample room for good mixing and which can serve as a reservoir of coating precursor material vapours which are then constrained to flow down towards the substrate and along towards the downstream end of the coating chamber passageway in a concentrated and uniform stream which is beneficial for the deposition of coating material from the vapour phase.

In some preferred embodiments of the invention, said roof structure descends as a curve leading into a downstream roof portion above said passageway. This is found to promote a smooth general downstream flow of the precursor vapour laden atmosphere within the coating chamber which is found to be beneficial for the uniformity of the coating formed therein.

Preferably, at least one pair of obliquely inwardly directed gas injectors is provided in said chamber to throttle the width of the stream of vapour flowing along at least part of the passageway. The use of such injectors is beneficial for protecting the side walls of the coating chamber against the corrosive action of vaporised coating precursor material and coating reaction products.

Advantageously, said coating chamber has a length of at least 5 metres. The use of such a long coating chamber is of particular benefit in increasing the coating yield which is useful when forming relatively thick coatings, for example more than 400 nm thick, on a rather rapidly moving substrate, for example a ribbon of freshly formed float glass.

Preferably, said passageway occupies at least the downstream end 2 metres of the length of said chamber and has there a height or maximum height not exceeding 75 cm above the substrate path. It has been found that the adoption of this feature is also beneficial for promoting the rate at which the coating is built up, and it is particularly valuable for the formation of relatively thick coatings, for example those above 400 nm in thickness.

In the most preferred embodiments of the invention, a curved exhaust scoop extending across at least the major part of the substrate path is provided at the downstream end of said coating chamber, which scoop defines in part at least one exhaust duct inlet. Such an apparatus is of simple construction and it is easy to locate. The use of a curved scoop is particularly valuable in guiding material to be aspirated smoothly into the exhaust duct inlet, and helps to avoid surges of back-pressure there which could disrupt the atmospheric currents in the passageway. It is particularly desirable to use such a scoop which extends across the full width of the coating chamber and which is adjustable in height above the substrate path, for example by means of a pivotal mounting, so as to achieve the maximum closure of the downstream end of the coating station.

In especially preferred embodiments of the invention, a barrier wall is provided above the substrate path extending across the full width of and substantially closing the downstream end of said coating chamber. This is a very simple way of ensuring that changes in conditions immediately downstream of the end of the coating chamber will have no direct effect on conditions within the coating chamber, and vice versa. Such a barrier wall may for example be constituted by a said exhaust scoop.

In particularly preferred embodiments of the invention, said coating station is located between the exit from a ribbon-forming plant and the entrance to an annealing lehr. When this is done, it will be found that the glass can reach the coating station at a temperature which is, or is close to, that required for the pyrolytic coating reactions to take place. Accordingly, the adoption of this feature dispenses with the need for further heating apparatus such as would be required to raise the temperature of the glass to be coated from room temperature.

In some particularly preferred embodiments of the invention, means is provided for causing gas to flow through a substrate entry slot of said chamber from upstream thereof and for preheating that gas, and advantageously, the means causing such gas entry, and/or the shape of the entry slot, is or is adjustable so as to cause a greater volume flow rate of such gas over margins of the substrate path than over its centre. The adoption of this feature is of value in promoting a general downstream flow of the atmospheric material within the coating chamber and has value in conditioning the atmosphere in the zone where coating formation commences. For example, it may allow at least partial compensation for cooling of the atmosphere within the coating chamber by contact with its side walls.

Apparatus according to the present invention may with advantage also incorporate one or more features of apparatus disclosed in in our said copending British patent application filed 20th Dec. 1985, Application No. 85 31 425, which application describes and claims apparatus for pyrolytically forming a metal compound coating on an upper face of a hot glass substrate in sheet or ribbon form comprising conveyor means for conveying a said substrate along a path in a downstream direction, a roof structure defining a coating chamber opening downwardly onto said path and means for discharging coating precursor material into said chamber, characterised in that upstream of said coating chamber there is an antechamber which communicates with the coating chamber via an entry slot which is defined in part by the path of the substrate, and via which gas can be caused to flow into the coating chamber so as to form (when the apparatus is in use) a blanket layer which covers the upper face of the substrate along a first part of the length of said chamber, and in that means is provided for controllably preheating the gas forming said blanket layer.

BRIEF DESCRIPTION OF THE DRAWING

This invention will now be described in greater detail with reference to the accompanying diagrammatic drawings of various preferred embodiments of apparatus according to the invention and by way of Examples of specific processes according to the invention performed using such apparatus.

In the drawings.

DESCRIPTION OF THE PREFERRED EMBODIMENTS

FIGS. 1 to 4

Figure 1:
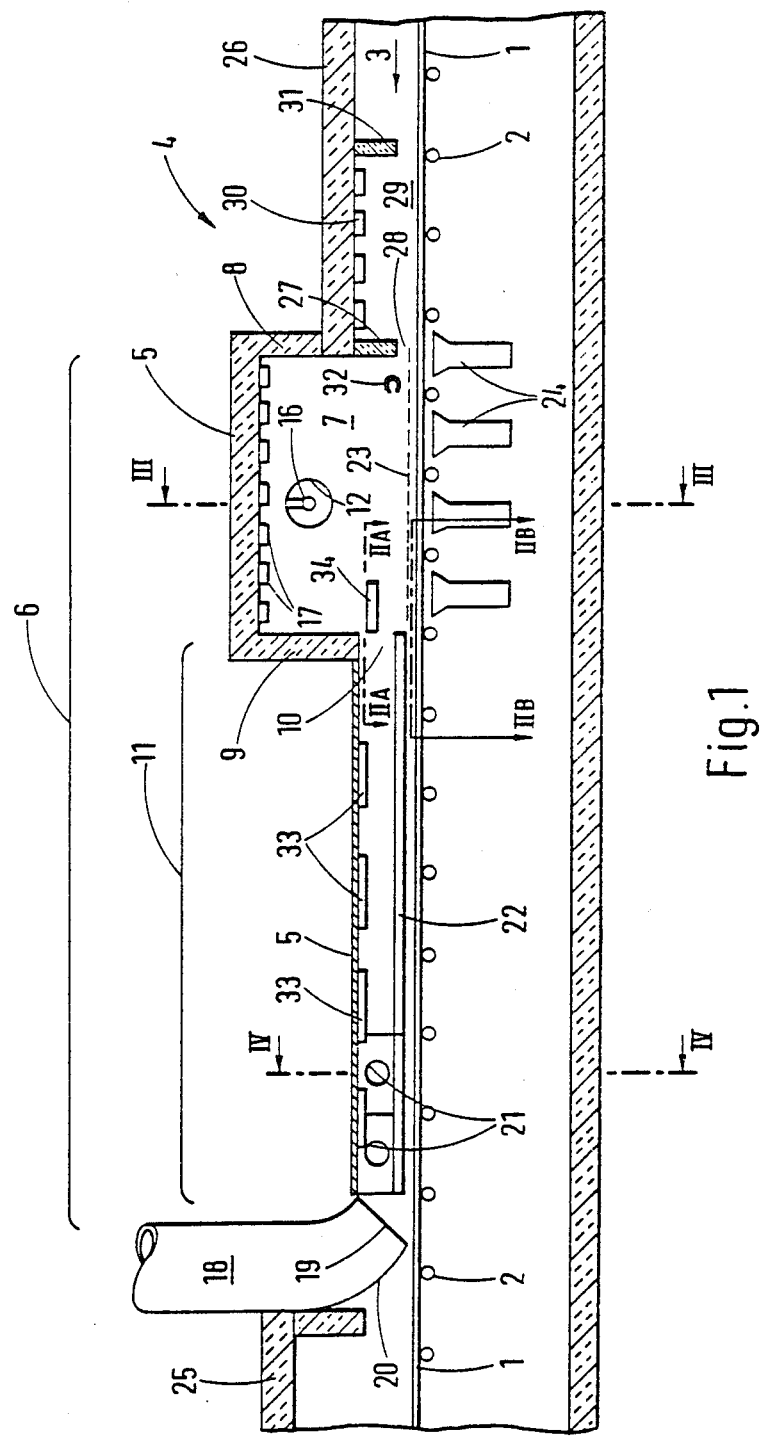
FIG. 1 is a cross-sectional side view of a first embodiment of coating apparatus in accordance with the invention.

In FIGS. 1 to 4, apparatus for pyrolytically forming a metal compound coating on an upper face of a heated glass substrate 1 in sheet or ribbon form comprises conveyor means such as rollers 2 for conveying a substrate in a downstream direction 3 along a path also indicated by reference numeral 1. The path 1 leads through a coating station 4 comprising a roof structure 5 defining a coating chamber 6 opening downwardly onto the substrate path 1. The roof structure 5 defines an elevated upstream zone 7 of the coating chamber 6 having an upstream end wall 8 and terminating in a vertical bridge wall 9 at its downstream end beneath which an exit slot 10 gives vapour flow communication with a passageway 11 which is formed as a downstream continuation of the upstream zone 7 of lesser height, and which gives the coating chamber a total length of at least 2 metres; and preferably at least 5 metres.

In a variant embodiment, the roof structure 5 continues horizontally, so that the passageway 11 is of the same height as the upstream zone 7.

Means is provided for discharging coating precursor material and oxidising gas into the upstream zone 7 of the coating chamber 6 and for subjecting such material to mixing forces so that they become mixed within the upstream zone 7. The means for discharging precursor material into such mixing zone 7 is illustrated more clearly in FIG. 3.

Such discharge means comprises a discharge duct 12 leading through each side wall 13 of the coating chamber 6, and containing an impeller 14 for forcing air into the mixing zone 7. The discharged air is suitably preheated, for example by burners or by a heat exchanger (not shown), for example to a mean temperature in the range 300° C. to 500° C. A coating precursor conduit 15 for conveying liquid coating precursor material leads to a discharge nozzle 16 located in the mouth of each discharge duct 12 and directed into the mixing zone 7. The discharge nozzles 16 are of the ultra-sonic pulverisator type and generate an aerosol, or fog of microdroplets, of the coating precursor material. This is rapidly vaporised, or maintained in the vapour phase by the preheated air discharged through the ducts 12, and by downwardly directed radiant heaters 17 which are fixed to the roof 5 of the mixing zone 7 and provide additonal heat. The effect is that a reservoir of atmosphere richly laden and well mixed with coating precursor vapour is maintained in the mixing zone 7.

At the downstream end of the passageway 11, atmospheric material is aspirated into exhaust ducting 18 having an inlet 19 defined in part by a curved exhaust scoop 20. The scoop extends above the path of the substrate 1 across the full width of the passageway, and substantially closes its downstream end. This substantially prevents the flow of atmospheric material into or out of the coating chamber 6 at the downstream end of the passageway 11. The scoop 20 may optionally be mounted pivotally so that it can be adjusted for minimum clearance with the substrate 1. Also at the downstream end of the passageway 11, atmospheric material is aspirated into side exhaust ducting 21 located to each side of the coating chamber, in order to encourage a lateral spread of the atmospheric material flowing along the coating chamber.

Such aspiration acts to draw precursor laden atmosphere from the mixing zone 7, through its exit slot 10 and into and along the passageway 11.

Along the length of the passageway 11, baffles 22 are provided at each side of the coating chamber projecting inwardly from the side walls of the coating chamber and over the margins of the substrate 1. These baffles extend over the full length of the substrate path occupied by the passageway, and they act to inhibit the interchange of atmospheric material between zones located vertically above and vertically below the substrate 1.

Figure 2:
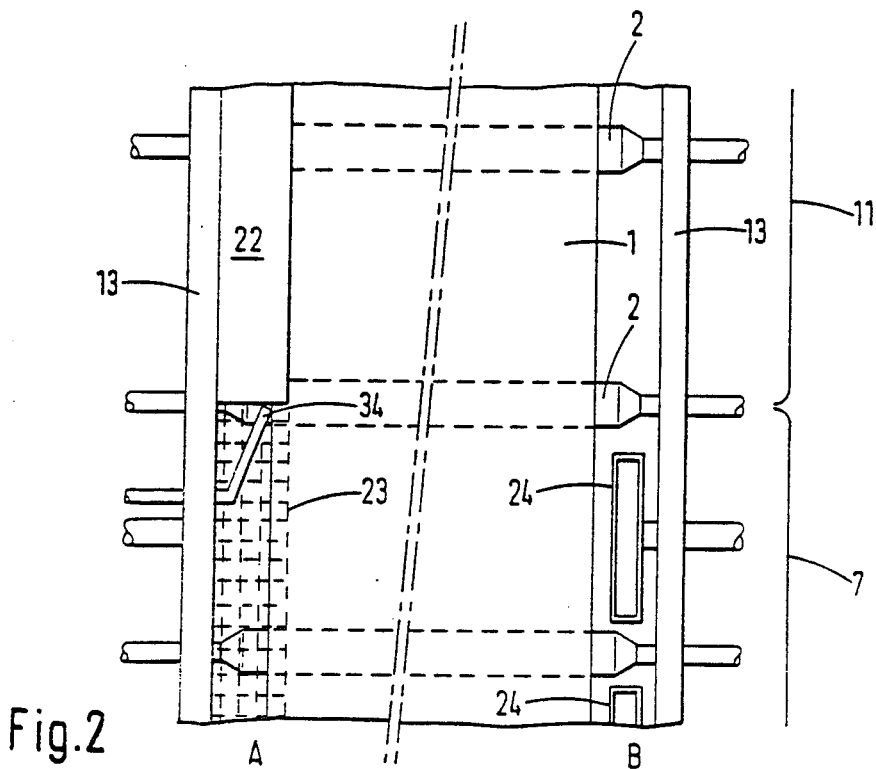
FIG. 2 on its left hand side is a section along the line IIA—IIA of FIG. 1, and on its right hand side is a section along the line IIB—IIB of FIG. 1.
Figure 3:
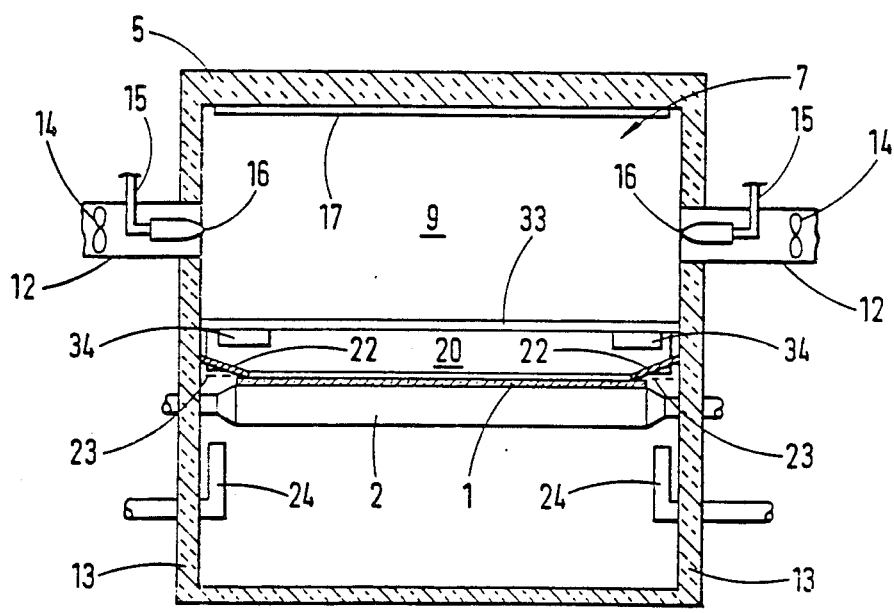
FIG. 3 is a section along the line III—III of FIG. 1.
Figure 4:
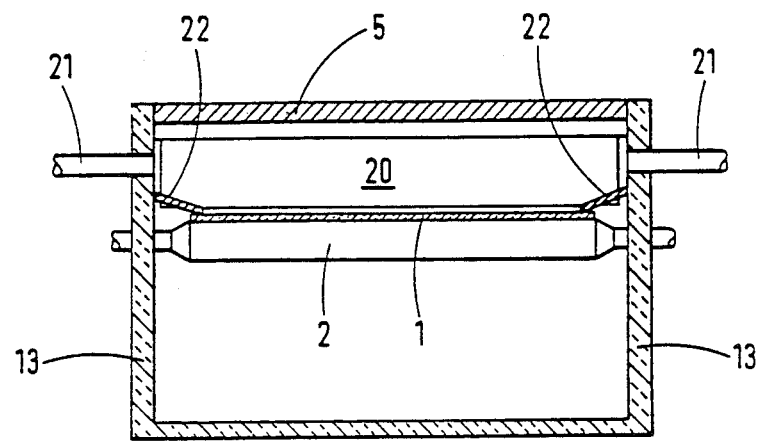
FIG. 4 is a section along the line IV—IV of FIG. 1, FIGS. 5 and 6 are respectively cross-sectional side views of second and third embodiments of coating apparatus in accordance with the invention.

At the base of the mixing zone 7, those baffles 22 are replaced by mesh screens 23, also shown in FIGS. 2 and 3, which project over the margins of the substrate. The mesh screens 23 are positioned above upwardly directed blowers 24 located to blow hot air up past the side margins of the substrate and into the mixing zone. This has the effect of inhibiting precursor rich vapours from descending from the mixing zone to contact the under surface of the ribbon where it could cause undesired coating deposition, and furthermore, it creates a relatively dilute and hot atmosphere in contact with the side walls of the mixing chamber, so protecting them against corrosion, inhibiting condensation on those side walls, and tending to compensate for heat losses through them.

The coating station 4 is located between the exit from a ribbon forming plant (not shown), for example a float tank, and the entrance to an annealing lehr 25.

A passage leading from the ribbon forming plant to the coating chamber 6 has a roof 26 from which depends a screening wall 27 at the upstream end of the coating chamber 6, to allow clearance for the substrate 1 to pass into the coating chamber via an entry slot 28.

The effect of this screening wall 27 is to limit the flow of atmospheric material into the coating chamber 6 from the upstream direction, so that atmospheric conditions within that chamber can more easily be controlled.

Upstream of the screening wall 27 there is an antechamber 29 in which heating means 30 are provided. Such heating means may be radiant heating means, for example a finned radiator, or it may comprise one or more burners. A second screening wall 31 is provided above the substrate path at the upstream end of the antechamber 29.

In operation, a semi-natural current of gas will be drawn into the upstream end of the coating chamber 6 from the antechamber 29 so that the gaseous environment in the immediate vicinity of the upper face of the substrate 1, at least in the zone at which coating formation commences, may be controlled by preheated gas fed in the downstream direction 3 into the chamber 6 to enter the chamber in contact with the substrate 1 and form a blanket layer which covers the substrate at least as far as the zone of contact with the coating precursor material. In this way, use may be made of the invention described in our said copending British patent application filed 20th Dec. 1985, Application No. 85 31 425.

This semi-natural gas current may be augumented or conditioned by preheated gas discharged from a discharge conduit 32 located adjacent the entry slot 28, which also acts to prevent vapours from flowing upstream from the mixing zone 7 through that slot.

The downstream flow from the mixing zone 7 is throttled downwardly by the bridge wall 9 over the exit slot 10, so that coating precursor vapours are constrained to flow in contact with the substrate, and during such contact a coating is pyrolytically formed on the glass. To promote coating yield and quality, and to inhibit condensation of vapours on the roof 5 of the passageway 11, heaters 33 are provided beneath the passageway roof.

That downstream flow is also throttled at the sides. At the downstream end of the mixing zone, a pair of horizontally directed inwardly inclined gas jet discharge nozzles 34 is provided for entraining the coating precursor vapour which will be generated within the mixing zone inwardly away from the side walls of the passageway and in the downstream direction.

EXAMPLE 1

The apparatus of FIGS. 1 to 4 was used to deposit a 30 nm thick coating of titanium dioxide on a ribbon of glass 6 mm thick travelling at a speed of 4.5 m/min which entered the coating chamber at a temperature of 600° C. The total length of the coating chamber 6 was 5 metres.

A pair of ultra-sonic pulverisators available from Giesler SA. (France) under their Trade Mark SONICORE was used to form an aerosol of titanium acetylacetonate in air, each pulverisator delivering about 2 kg/h of precursor from a height of just above 50 cm above the substrate. The discharge was given a helicoidal form by the action of the impellers.

The mixing zone became filled with a cloud of aerosol which rapidly vaporised inter alia due to the roof heaters. These vapours were drawn downstream by the aspiration at the downstream end of the passageway 11, assisted by gas discharged at 600° C. from the discharge conduit 32 near the entry slot, and by the side-throttling gas jets from nozzles 34.

The result was a coating of extremely high and uniform quality over the full width of the ribbon except for those marginal parts covered by the baffles 22.

In a variant of this Example, a 100 nm thick coating of tin oxide was deposited using tin dibutyldiacetate. This also was of excellent and uniform quality over the full width of the ribbon except for its marginal parts.

FIG. 5

Figure 5:
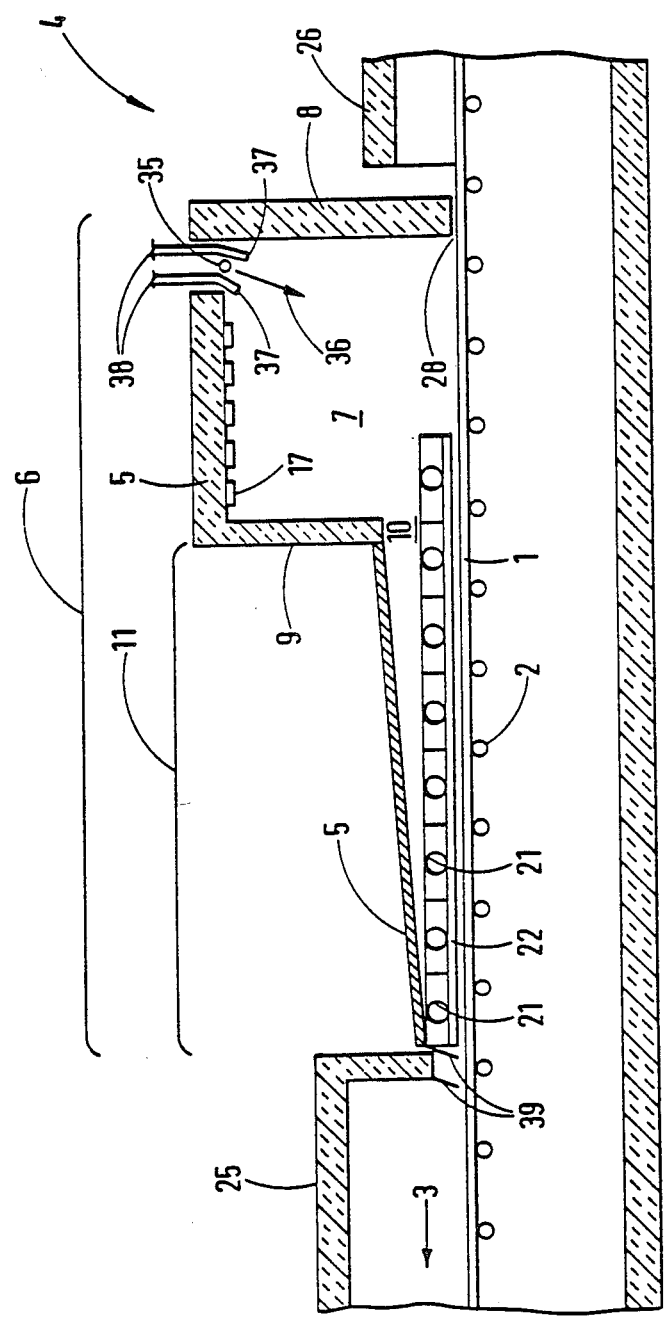

In FIG. 5, integers serving analogous functions to those shown in FIGS. 1 to 4 have been allotted corresponding reference numerals.

In FIG. 5, the upstream end wall 8 descends almost to the level of the substrate 1, leaving only a very small entry slot 28, in order substantially to prevent any gas entering the coating chamber 6 from upstream.

The coating precursor discharge means comprises a spray nozzle diagrammatically represented at 35 for spraying a stream of coating precursor solution into the mixing zone 7 of the coating chamber 6. The discharge axis of the spray nozzle 35 is indicated at 36, and this leads in the downstream direction 3, downwardly towards the substrate 1.

In the embodiment illustrated, the spray nozzle 35 is located to spray coating precursor material from a height of at least 60 cm above the substrate path 1 and it is of a type well known per se. In other embodiments, such discharge height may be in excess of 75 cm and it is preferably at least 1.2 metres. The nozzle is movable to and fro along a track (not shown) across the width of the substrate path, between a pair of gas discharge slots 37 fed with preheated air via ducting 38. Air issuing from these slots forms a hot air curtain at each side of the travelling stream of sprayed precursor material and in which material evaporated from the sprayed stream, mainly due to the heat provided by the heaters 17, becomes entrained and mixed. The reciprocating movement of the nozzle 35 and the consequent movement of the discharged material create substantial turbulence within the upper part of the mixing zone 7, so promoting intimate mixing of the vaporised precursor material and the hot air.

In the passageway 11, the over substrate exhaust ducting 18 is removed, but additional side exhaust ducts 21 are provided. In fact these exhaust ducts 21 are distributed over the full length of that passageway, and the most upstream of those ducts is within the mixing zone 7. Baffles 22 extend along beneath the entrances to all these side exhaust ducts. To compensate for the progressive reduction of atmospheric material travelling along the passageway due to this increased side aspiration, the roof structure 5 descends towards the substrate 1 in the downstream direction 3 along the passageway.

The downstream end of the passageway 11 is closed by two gates 39 hinged respectively to the roof structure 5 and to the entrance to the annealing lehr 28 so as to prevent interchange of atmospheric material between the lehr and the coating chamber, while allowing the possibility of additional clearance, for example for broken glass in case the ribbon should break due to some accident in the plant.

EXAMPLE 2

The apparatus of FIG. 5 was used to form a coating of a mixture of metal oxides namely: $Fe_2O_3 = CoO = Cr_2O_3$ by spraying a solution in dimethylformamide of a mixture of the acetylacetonates of iron(II), cobalt(II) and chromium(III).

The spray nozzle 35 was arranged to discharge the coating precursor solution from a height of 60 cm at it travelled to and fro across the substrate path with its discharge axis 36 inclined at 45° to the horizontal. The quantity of solution discharged was about 100 L/h to form a coating 45 nm thick on a float glass ribbon 4 mm thick advancing at a speed of 11 m/min.

The glass entered the coating chamber which had a total length of 7 metres at a temperature of 580° C., and air preheated to 375° C. was discharged from the slots 37 at a rate of 1500 Nm³/h. Substantially all the sprayed solution was evaporated before contact with the glass by heating due to the roof heaters 17, and the precursor vapour thus formed was entrained in the air streams from those slots and drawn downstream by the side exhaust ducting 21 in which aspirating forces were regulated to achieve a uniform coating of the desired thickness.

The coating formed had excellent uniformity of thickness over substantially the whole usable width of the ribbon, and it had very high optical quality.

FIGS. 6 & 7

Figure 7:
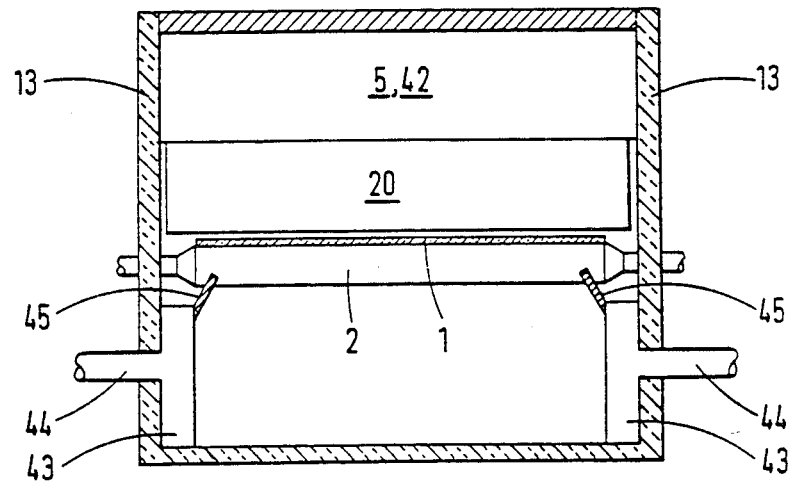
FIG. 7 is a section along the line VII—VII of FIG. 6.
Figure 6:
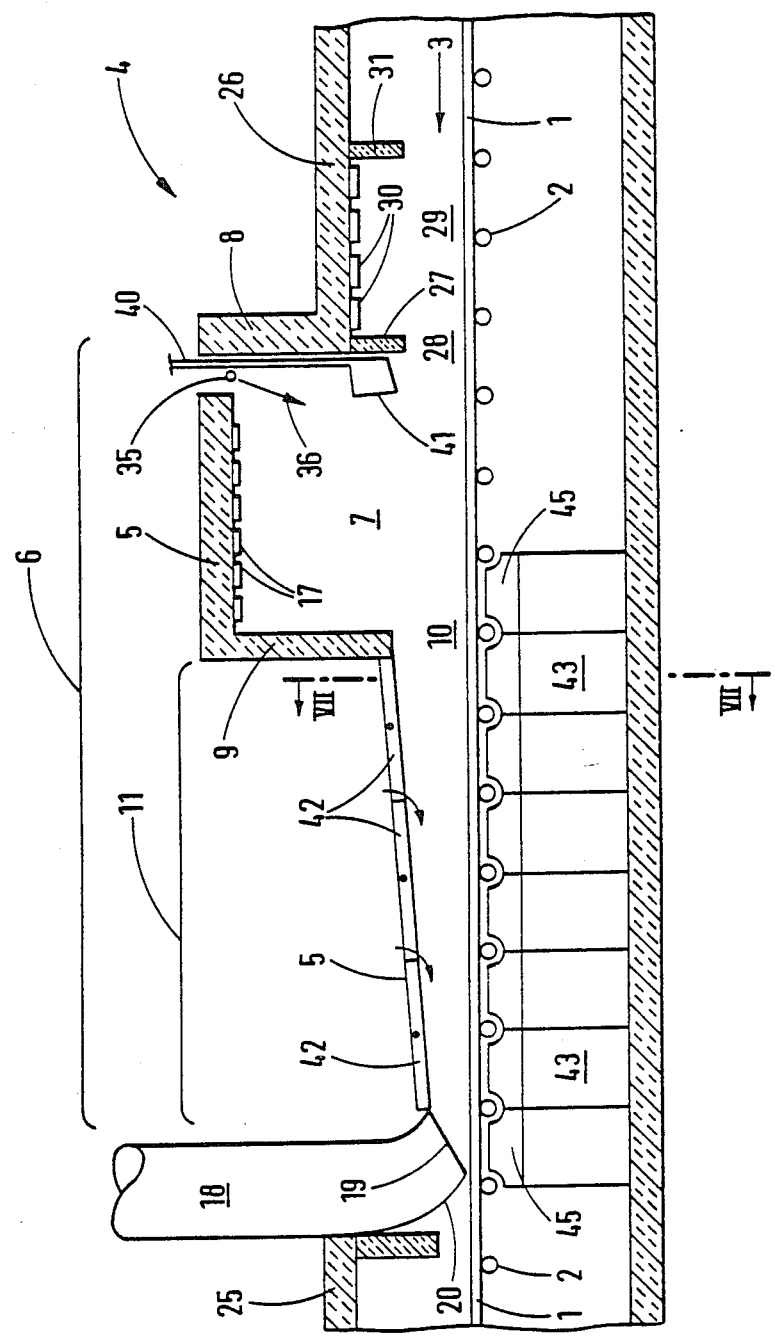

In FIGS. 6 and 7, integers serving analogous functions to those shown in the preceding Figures have again been allotted corresponding reference numberals.

In the mixing zone 7 at the upstream end of the coating chamber 6, gas discharge ducting 38 is absent, but is replaced by ducting 40 having a discharge orifice 41 which is directed towards the upstream side of the sprayed stream of coating precursor material. The discharge orifice 41 has a lesser width than the coating chamber 6, and it is moved to and fro across the spraying zone in tandem with the spray nozzle 35. In a variant, the discharge orifice 41 extends across almost the full width of the coating chamber 6.

Downstream of the exit slot 10 beneath the bridge wall 9, the roof structure 5 continues, to define a passageway portion 11 of the coating chamber 6 which descends in the downstream direction. In this embodiment however, the roof structure over the passageway 11 is formed by a plurality of louvres 42 which are pivotally openable so that preheated air can be caused to flow into the passageway and along its roof to augment the temperature there and to inhibit coating deposition or condensation on that roof.

Along the length of that passageway 11, exhaust means is provided at each side of the coating chamber beneath the level of the substrate path 1. This exhaust means comprises a plurality of open-topped exhaust boxes 43 communicating with exhaust ducts 44 (see FIG. 7). From FIG. 6 it will be noted that these exhaust boxes 43 extend over the full length of the substrate path occupied by the passageway, and that the upstream exhaust box is in fact located beneath the mixing zone. Baffles 45 project upwardly and inwardly from the exhaust boxes to extend beneath the margins of the substrate path and between the conveyor rollers 2. This arrangement provides an effective separation of the atmospheres vertically above and vertically below the substrate path along the passageway.

EXAMPLE 3

The apparatus of FIGS. 6 and 7 was used to form a doped tin oxide coating 750 nm thick on a 3 m wide ribbon of 6 mm float glass travelling at 8.5 m/min, and entering the coating chamber with a temperature of 600° C. The coating chamber had a total length of 8 metres. An aqueous solution of stannous chloride containing ammonium bifluoride was discharged at a rate of about 220 L/h at a pressure of 25 bar from a height of 1.8 m above the glass using a spray nozzle inclined in the downstream direction at an angle of 50° to the horizontal and which was reciprocated across the ribbon path at a rate of 23 cycles per minute.

The total amount of atmospheric material aspirated through the exhaust ducting 18 and 44 was about 100,000 m³/h at a temperature of about 300° to 350° C.

Hot air was blown into the mixing zone 7 through the discharge orifice 41 ganged to the spray nozzle, at a temperature of 600° C. and at a rate of about 500 m³/h. Radiant roof heaters 17 helped to ensure evaporation of the great majority of the coating precursor material and solvent before contact with the glass. Preheated air was drawn into the coating chamber 6 from the upstream antechamber 29 to contribute to the atmospheric material aspirated.

In a variant, the discharge orifice 41 extended the full with of the coating chamber, and it was used for the discharge of air heated to 600° C. at a rate of 25,000 m³/h.

As a result, the coating formed had a high quality uniform structure and thickness over the full width of the ribbon and hence good optical qualities. The inclusion of coating reaction products which would lead to defects was substantially avoided.

Preheated air was drawn into the coating chamber 6 from the antechamber 29 through the entry slot 28. This again also made use of the invention described in our said copending British patent application filed 20th Dec. 1985, Application No. 85 31 425.

In a variant, preheated air was blown positively into the antechamber 29.

FIGS. 8 & 9

Figure 8:
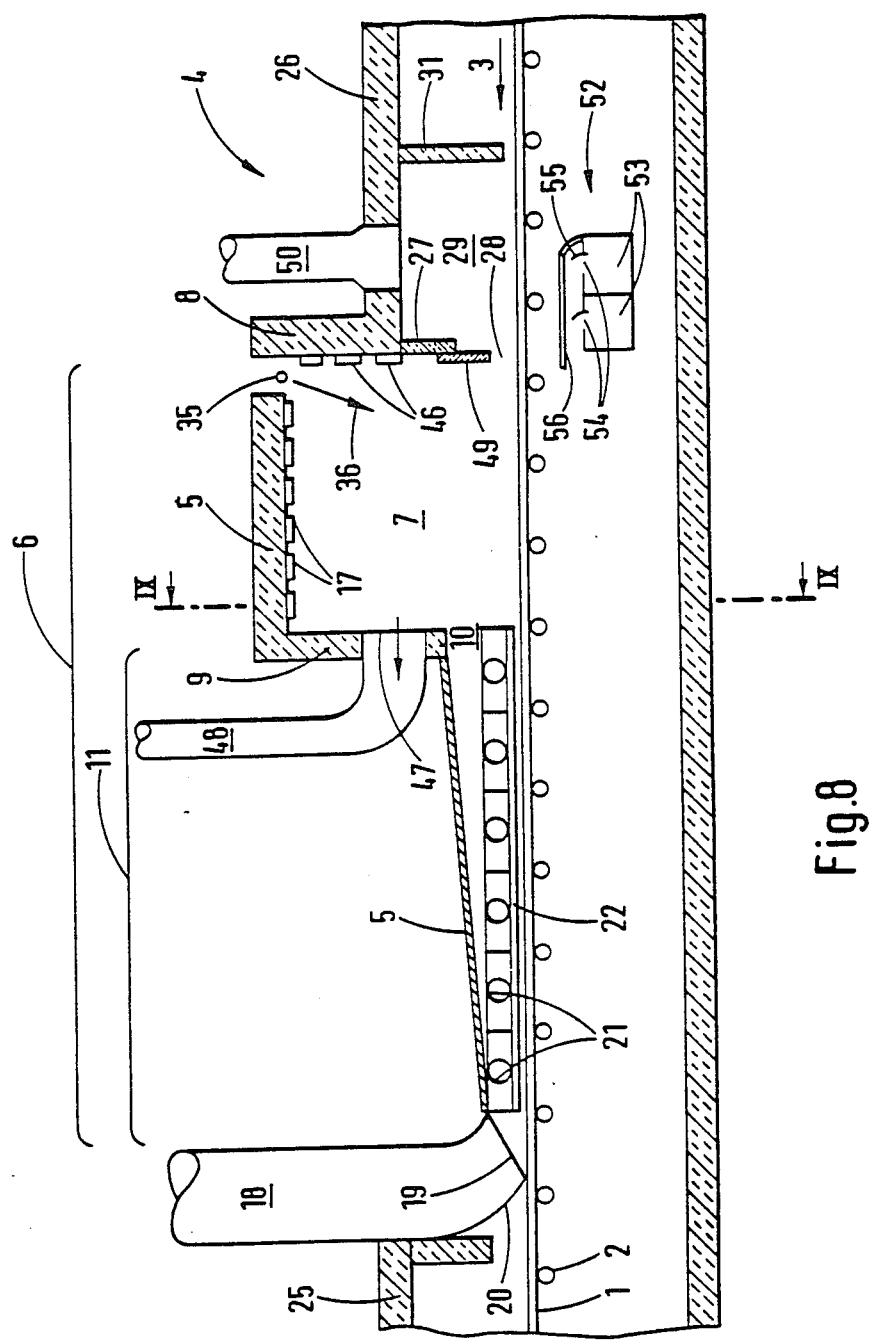
FIG. 8 is a cross-sectional side view of a fourth embodiment of coating apparatus in accordance with the invention.
Figure 9:
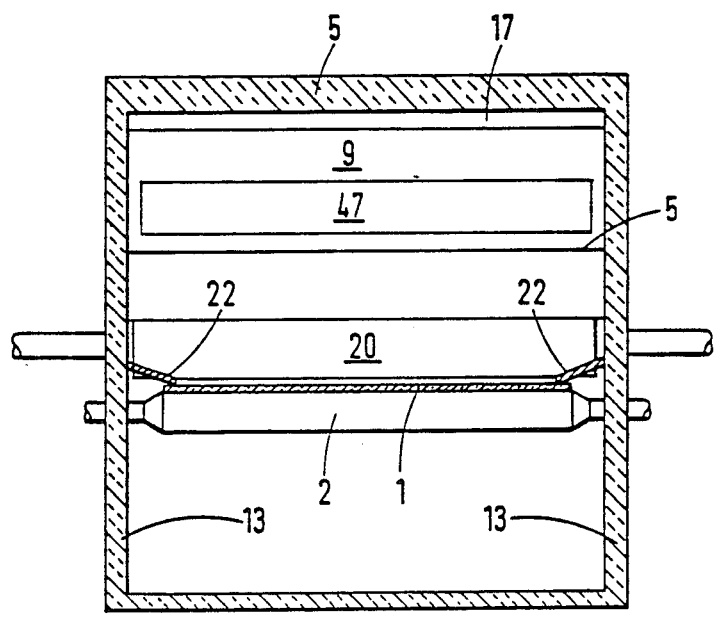
FIG. 9 is a section along the line IX—IX of FIG. 8.

In FIGS. 8 and 9, integers serving analogous functions to those shown in the preceding Figures have again been allotted corresponding reference numerals.

In the embodiment of FIGS. 8 and 9, heaters 46, additional to the roof heaters 17, are provided on the upstream end wall 8 of the coating chamber for promoting evaporation especially at the rear of the stream of coating precursor material sprayed from the nozzle 35.

At the downstream side of the mixing zone 7, the roof structure again descends to form a vertical bridge wall 9. A full width inlet 47 for exhaust ducting 48 for the aspiration of vapours from the mixing zone is located in the bridge wall 9 to prevent the formation of any stagnant zone in the mixing zone.

At the entry slot 28 to the coating chamber 6, the screening wall 27 separating the coating chamber from the antechamber 29 carries a vertically movable gate 49 allowing a variable entry slot 28 so that the rate at which atmospheric material can be drawn into the coating chamber from the antechamber 29 can be controlled more easily. The gate 49 may be constructed in several independently movable sections so that the opening of the entry slot 28 can be varied across the path of the substrate 1. Additionally, gas discharge ducting 50 is provided for discharging preheated gas downwardly into the antechamber for forming the layer of atmospheric material immediately above the substrate 1 up to at least the zone where coating formation commences. The upstream end of the antechamber is substantially closed by barrier wall 31.

Means 52 is provided for discharging gas into the environment of the substrate 1 so as to form a continuous current flowing in the downstream direction 3 beneath each margin of the substrate path 1 and along at least part of the path length occupied by the coating chamber 6.

The below ribbon gas discharge means 52 comprises four plenum chambers 53 located two by two and extending across substantially the full width of the coating station 4. In the top of each plenum chamber 53 is formed a slot 54 bordered by a deflector lip 55 so that gas injected through the slots 54 is directed in the downstream direction 3 along the coating station 4. The slots 54 extend the full length of each plenum chamber 53 across the coating station 4. If desired such slots could be replaced by a plurality of spaced orifices. As shown in FIG. 1, a deflector plate 56 is located above the plenum chambers 53 so that the injected gas is not discharged directly against the substrate 1. The plenum chambers 53 may be fed with preheated gas from both sides of the coating station 4, for example from heat exchangers. Air may be used as the discharged gas and this may readily be heated by heat exchange with furnace flue gases. Such gas is preferably preheated to within 50° C. of the temperature of the substrate as the latter enters the coating chamber 6.

Gas discharged beneath the substrate 1 may be removed from the environment of the substrate 1 through optional exhaust ducting (not shown) having one or more inlets extending transversely under the substrate path for example located in register with the above path exhaust inlet 19.

EXAMPLE 4

The apparatus of FIGS. 8 and 9 was used to form a tin oxide coating 750 nm thick doped with 0.2% antimony oxide on a 3 m wide ribbon of 6 mm float glass travelling at 8.5 m/min, and entering the coating chamber with a temperature of 600° C. The coating chamber had a total length of 8 metres. An aqueous solution of stannous chloride containing antimony chloride was discharged at a rate of about 230 L/h at a pressure of 25 bar from a height of 1.5 m above the glass using a spray nozzle inclined in the downstream direction at an angle of 47° to the horizontal which was reciprocated across the ribbon path.

Heaters 17 and 46 were controlled to evaporate substantially all the sprayed material within the upper half of the mixing zone 7, and because of the reciprocation of the spraying nozzle 35 and the current pattern caused thereby, this evaporated material became intimately mixed with the air within that part of the mixing zone.

The total amount of atmospheric material aspirated through the exhaust ducting 18 and 21 was about 60,000 m³/h at a temperature of about 350° C. Aspiration through the mixing zone ducting 48 was maintained at the minimum level necessary to keep the atmosphere in the upper part of the downstream end of the mixing zone 7 clear.

Hot air was blown into the antechamber 29 through the ducting 50 at a temperature of 620° C. (the same temperature as the ribbon there) and at a rate of about 7000 Nm³/h. The gate 49 was adjusted so that the entry slot 28 had a uniform opening across the width of the ribbon.

Air preheated to 550° C. was discharged at a rate of 3000 Nm³/h from the below substrate path discharge means 22.

This process also resulted in the formation of a substantially defect free coating, in this case of a bluish aspect, having excellent optical properties and uniformity of thickness.

FIG. 10

Figure 10:
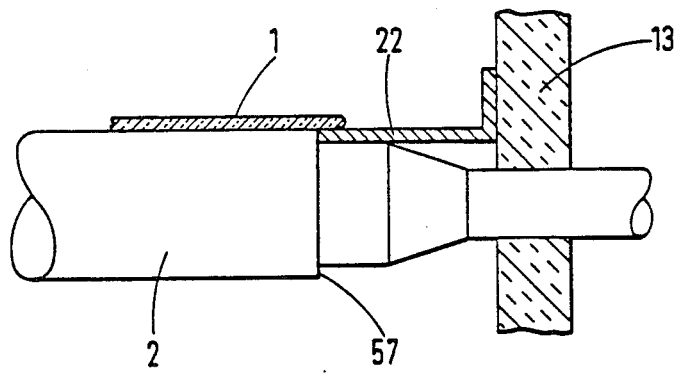
FIG. 10 is a detail showing a variant construction viewed in the same direction as FIG. 9.

FIG. 10 shows a modification relating to the side baffles 22. In FIG. 10, the conveyor rollers 2 are rebated at 57 towards their ends and this provides a clearance into which the baffles 22 attached to the side walls 13 of the coating chamber may fit, beneath the margins of the substrate 1. This provides a better closure of the coating chamber, and it does this without shielding even the margins of the substrate from contact with coating precursor material. The embodiments illustrated in FIGS. 1 to 4, 5, 8 and 9, or 11 next to be described, may readily be modified in this way.

FIG. 11

Figure 11:
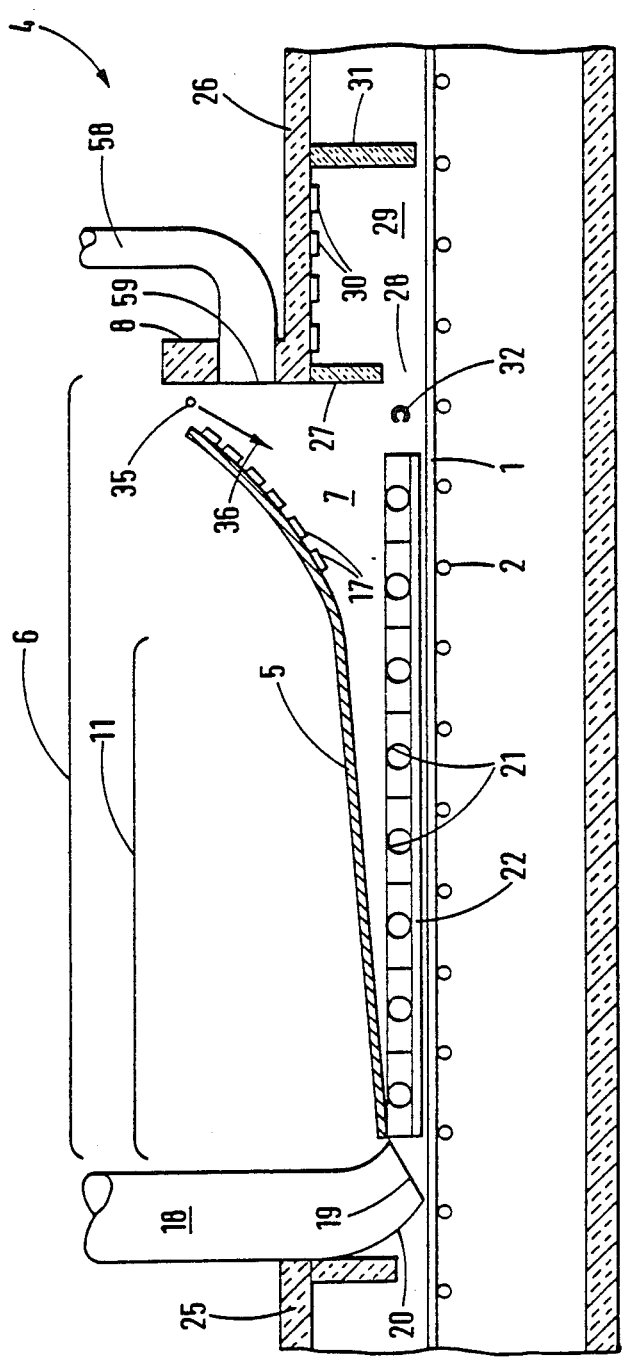
FIG. 11 is a cross-sectional side view of a fifth embodiment of coating apparatus in accordance with the invention.

In the embodiment of FIG. 11, ducting 58 is provided for discharging a stream of preheated air into the mixing zone 7 in a direction to intersect the sprayed stream of coating precursor material. The ducting 58 has its discharge orifice 59 located in the upper half of the height between the spray nozzle 35 and the substrate 1, and is arranged to discharge that gas stream from upstream of the coating precursor spray discharge axis 36. The orifice 59 extends horizontally over the full width of the substrate path 1, and vertically over the upper third of the height of the spray nozzle 35 above the glass substrate. Air discharged from orifice 59 is initially directed substantially horizontally, across the transverse path of the droplet stream, to maintain a flow of atmospheric material through the mixing zone 7.

The discharged air is suitably preheated, for example to a mean temperature in the range 300° C. to 600° C. The heaters 17 promote evaporation of solvent from the sprayed droplets during their travel towards the substrate 1, and the evaporated material becomes entrained and mixed in that preheated air.

In an optional variant embodiment, the ducting 58 for discharging the air current is divided into two ducts terminating in equal sized upper and lower orifices occupying the position of the orifice 59 so that currents of air at different temperatures, for example 400° C. and 600° C. can be discharged at different levels there.

The roof structure 5 descends in a continuous partly curved profile above the mixing zone 7 to facilitate a smooth general downstream flow of material within the coating chamber 6. The roof structure 5 continues to descend so that the passageway 11 is of decreasing height in the downstream direction in order to compensate for a reducing content of atmospheric material due to aspiration from the passageway through side exhaust ducts 21 provided over its whole length.

EXAMPLE 5

The apparatus of FIG. 11 was used to form a 400 nm thick fluorine doped tin oxide coating on a 5 mm thick ribbon of glass travelling from a float chamber at a speed of 8.5 m/min to enter the coating station at a temperature of 600° C. The coating chamber had a total length of 8 metres.

The coating precursor material used was an aqueous solution of stannous chloride containing ammonium bifluoride for the provision of doping ions in the coating. This solution was sprayed from the nozzle at a rate of 110 L/h under a pressure of 23 bar while the nozzle was reciprocated at a rate of 22 cycles per minute. The nozzle was disposed as in Example 4.

Air preheated to 600° C. was discharged at a rate of 5400 Nm$^3$/h from the discharge orifice 59, and the air discharged from the auxiliary gas discharge conduit 32 was also preheated to 600° C. The antechamber 29 included burners 30 for preheating the atmosphere therein. Aspiration above the level of the substrate was maintained at a rate of 80,000 m$^3$/h to maintain a general downstream flow of material within the coating chamber.

This process also resulted in the formation of a highly uniform coating, substantially free from local defects.

EXAMPLE 6

Apparatus based on that shown in FIG. 11 was used to form a tin oxide coating 250 nm in thickness. That apparatus was modified by the exclusion of the antechamber 29 and the discharge conduit 32. The length of the coating chamber 6 was about 6 metres.

Sheets of glass were successively conducted through the coating chamber at a temperature of 600° C. with a speed of 10 m/min.

The coating precursor used was a solution of stannous chloride containing ammonium bifluoride for the provision of doping ions in the coating. This solution was sprayed from the nozzle at a rate of 70 L/h under a pressure of 20 bar while the nozzle was reciprocated at a rate of 22 cycles per minute. The nozzle was located 1 metre above the level of the glass and was angled downwardly at 45°.

Air preheated to 600° C. was discharged into the spraying zone through discharge orifice 59. The rate of such discharge and the rate at which atmospheric material was aspirated from the coating chamber were adjusted to achieve a coating of the required thickness.

The coating formed by the process of this Example was also of extremely high quality and uniform appearance, and was substantially free from local defects.

EXAMPLES 7 to 11

In a variant of each of the preceding Examples 1 to 5, the apparatus illustrated is used to form a coating onto glass which has been cut into sheets and then reheated.

Similar results in terms of coating quality are given.

We claim:

1. A process for pyrolytically forming a metal oxide coating on an upper face of a hot glass substrate in sheet or ribbon form, comprising:

conveying the hot glass substrate in a downstream direction along an apparatus having a coating path with an extended coating path length of at least 2 m and including a coating chamber and a passageway defined within the apparatus, the coating path leading beneath the coating chamber and the coating chamber opening downwardly onto the upper face of the hot glass substrate;

introducing oxidizing gas and coating precursor material into a mixing zone of the coating chamber, which coating precursor material is in the form of a volatilizable solution comprised of solvent and a metallic compound, which metallic compound is soluble in the solvent and is pyrolyzable by the hot glass substrate to form a metal oxide coating thereon and which coating chamber is positioned within or adjacent to the upstream end of said passageway;

supplying heat energy to the mixing zone to vaporize the coating precursor material and to maintain the coating precursor material in the vapor phase, wherein the coating precursor material in the vapor phase and oxidizing gas are thoroughly mixed in the mixing zone while exposed to the hot glass substrate but wherein mixing occurs at a height above the hot glass substrate such that metal oxide coating formation commences from and continues from a substantially homogeneous vapor mixture and wherein introduction of the coating precursor material into the mixing zone is made by spraying from a height of at least 50 cm above the level of the upper face of the hot glass substrate; and causing the substantially homogeneous vapor mixture to flow continuously from the coating chamber along the coating path and in contact with the upper face of the substrate by pressure lowering means.

2. A process according to claim 1, wherein the coating precursor material is fed into the mixing zone in one or more streams of droplets.

3. A process according to claim 1, wherein streams of coating precursor material and gas are introduced into said mixing zone in different directions so as to create turbulence to effect said mixing.

4. A process according to claim 1, wherein at least some of said gas which is fed to said mixing zone has been preheated.

5. A process according to claim 1, wherein atmospheric material within said passageway is heated from above.

6. A process according to claim 1, wherein atmospheric material is aspirated away from said substrate face at least at the downstream end of said passageway.

7. A process according to claim 1, wherein aspirating forces are generated in side exhaust ducting located to cause atmospheric material above the substrate to flow outwardly away from a central part of the substrate path over at least a part of the length of said passageway.

8. A process according to claim 7, wherein said atmospheric material is aspirated outwardly over a zone extending along substantially the whole length of said passageway.

9. A process according to claim 7, wherein said atmospheric material is aspirated outwardly at a level beneath the substrate.

10. A process according to claim 1, wherein over at least part of the length of the coating chamber, flow of atmospheric material past the side edges of the substrate and between zones vertically above and vertically below that substrate is inhibited.

11. A process according to claim 1, wherein gas is discharged into the environment of the substrate so as to form a continuous current flowing in the downstream direction beneath each margin of the substrate and along at least part of the length of said coating chamber.

12. A process according to claim 11, wherein there is such a below-substrate current of gas which flows under the full width of the substrate.

13. A process according to claim 1, wherein air is introduced through the roof of said passageway.

14. A process according to claim 1, wherein the downstream flow of atmospheric material to which said substrate face is exposed is throttled by a marked height reduction in the available flow path along the coating chamber.

15. A process according to claim 1, wherein at least one pair of obliquely inwardly directed streams of gas is introduced into said chamber to throttle the width of the stream of vapour flowing along at least part of the passageway.

16. A process according to claim 1, wherein the coating chamber is substantially closed at its downstream end to prevent interchange of atmospheric material between the downstream end of the passageway and a further downstream region of the substrate path.

17. A process according to claim 16, wherein the glass substrate is a freshly formed ribbon of hot glass and the coating is formed after that ribbon leaves a ribbon-forming plant, and before its entrance to an annealing lehr.

18. A process according to claim 1, wherein preheated gas is caused to flow downstream into said coating chamber in contact with the substrate.

19. A process according to claim 18, wherein such preheated gas is caused to enter said coating chamber at a higher volume rate over the margins of the substrate than over its centre.

20. Apparatus for use in pyrolytically forming a metal oxide coating on an upper face of a hot glass substrate in sheet or ribbon form, the apparatus comprising:
conveyor means for conveying the hot glass substrate in a downstream direction along a coating path with an extended coating path length of at least 2 m;
a roof structure defining a coating chamber opening downwardly onto the coating path and a passageway, wherein the coating chamber is positioned within or adjacent to the upstream end of the passageway and comprises a mixing zone;
means for injecting oxidizing gas into the mixing zone;
means for injecting coating precursor material in the form of a volatilizable solution comprised of solvent and a metallic compound, which metallic compound is soluble in the solvent and is pyrolyzable by the hot glass substrate to form a metal oxide coating thereon, into the mixing zone by spraying from a height of at least 50 cm above the level of the upper face of the hot glass substrte;
means for supplying heat energy to the mixing zone to vaporize the coating precursor material and to maintain the coating precursor material in the vapor phase so that the coating precursor material in the vapor phase and the oxidizing gas are mixed to form a coating atmosphere comprising a substantially homogeneous vapor mixture of coating precursor vapor and oxidizing gas, the mixing zone being in communication with the passageway to permit a stream of the coating atmosphere to flow along the passageway from the mixing zone; and
pressure lowering means for causing the coating atmosphere to flow continuously from the coating chamber along the coating path and in contact with the upper face of the substrate.

21. Apparatus according to claim 20, wherein means is provided for introducing streams of coating precursor material and gas into said mixing zone in different directions so as to create turbulence to effect said mixing.

22. Apparatus according to claim 20, wherein means is provided for preheating at least one stream of said gas entering the mixing zone.

23. Apparatus according to claim 20, wherein radiant heating means is provided in said mixing zone.

24. Apparatus according to claim 20, wherein means is provided for introducing heat energy into said passageway from above.

25. Apparatus according to claim 20, wherein means is provided for generating aspirating forces on atmospheric material within such passageway to encourage flow of that material along said passageway towards its downstream end and then away from the path of the substrate.

26. Apparatus according to claim 20, wherein means is provided for generating aspirating forces in side exhaust ducting located to cause atmospheric material above the substrate path to flow outwardly away from the centre of the substrate path over at least a part of the length of the passageway.

27. Apparatus according to claim 26, wherein such side exhaust ducting is located to aspirate said atmospheric material outwardly over a zone extending along substantially the whole of said passageway.

28. Apparatus according to claim 26, wherein said side exhaust ducting has entrances which are located beneath the level of said path.

29. Apparatus according to claim 20, wherein said passageway has a top wall which converges towards the glass substrate in the downstream direction.

30. Apparatus according to claim 20, wherein over at least part of the length of the chamber, means is provided for inhibiting flow of atmospheric material past the sides of the substrate path and between zones vertically above and vertically below that path.

31. Apparatus according to claim 30, wherein such flow inhibiting means comprises baffles.

32. Apparatus according to claim 31, wherein said conveyor means comprises rollers which are rebated over each margin of the substrate path to define a space for accommodating said baffles between the rollers and the margins of the substrate path.

33. Apparatus according to claim 20, wherein means is provided for discharging gas into the environment of the substrate path so as to form a continuous current flowing in the downstream direction beneath each margin of the substrate path and along at least part of the path length occupied by said chamber.

34. Apparatus according to claim 33, wherein means for discharging gas to form such a below path level current is located to discharge gas to form such a current over the full width of the substrate path.

35. Apparatus according to claim 20, wherein means is provided for introducing air through the roof of said passageway.

36. Apparatus according to claim 35, wherein the passageway roof is of louvred construction for controlling the introduction of such air.

37. Apparatus according to claim 35, wherein the passageway roof is of porous construction, and means is provided for blowing air through such roof.

38. Apparatus according to claim 20, wherein said roof structure exhibits a marked drop in height above the path in the downstream direction thereby to throttle the downstream flow of vapour along the coating chamber.

39. Apparatus according to claim 20, wherein said roof structure descends as a curve leading into a downstream roof portion above said passageway.

40. Apparatus according to claim 20, wherein at least one pair of obliquely inwardly directed gas injectors is provided in said chamber to throttle the width of the stream of vapour flowing along at least part of the passageway.

41. Apparatus according to claim 20, wherein said passageway occupies at least the downstream end 2 metres of the length of said chamber and has there a height or maximum height not exceeding 75 cm above the substrate path.

42. Apparatus according to claim 20, wherein a curved exhaust scoop extending across at least the major part of the substrate path is provided at the downstream end of said coating chamber, which scoop defines in part at least one exhaust duct inlet.

43. Apparatus according to claim 20, wherein a barrier wall is provided above the substrate path extending across the full width of and substantially closing the downstream end of said coating chamber.

44. Apparatus according to claim 20, wherein said coating station is located between the exit from a ribbon-forming plant and the entrance to an annealing lehr.

45. Apparatus according to claim 20, wherein means is provided for causing gas to flow through a substrate entry slot of said chamber from upstream thereof and for preheating that gas.

46. Apparatus according to claim 45, wherein the means causing such gas entry, and/or the shape of the entry slot, is or is adjustable so as to cause a greater volume flow rate of such gas over margins of the substrate path than over its centre.

* * * * *